United States Patent
Hsieh et al.

(10) Patent No.: US 9,136,814 B2
(45) Date of Patent: Sep. 15, 2015

(54) METHOD AND SYSTEM OF EQUALIZATION PRE-PREOCESSING FOR SOUND RECEIVNG SYSTEM

(71) Applicants: UNIVERSAL SCIENTIFIC INDUSTRIAL (SHANGHAI) CO., LTD., Shanghai (CN); UNIVERSAL GLOBAL SCIENTIFIC INDUSTRIAL CO., LTD., Nantou County (TW)

(72) Inventors: Cheng-Hui Hsieh, Changhua County (TW); Yu-Cheng Liu, Taichung (TW); Jin-Huang Huang, Taichung (TW)

(73) Assignees: UNIVERSAL SCIENTIFIC INDUSTRIAL (SHANGHAI) CO., LTD., Shanghai (CN); UNIVERSAL GLOBAL SCIENTIFIC INDUSTRIAL CO., LTD., Nantou County (TW)

( * ) Notice: Subject to any disclaimer, the term of this patent is extended or adjusted under 35 U.S.C. 154(b) by 329 days.

(21) Appl. No.: 13/721,753

(22) Filed: Dec. 20, 2012

(65) Prior Publication Data

US 2013/0243221 A1 Sep. 19, 2013

(30) Foreign Application Priority Data

Mar. 19, 2012 (TW) ............... 101109309 A (51) Int. Cl.
*H03G 5/00* (2006.01)
*H03G 5/16* (2006.01)
*H04R 29/00* (2006.01)
*H04R 3/00* (2006.01)
*G01D 5/00* (2006.01)
*H04R 1/22* (2006.01)

(52) U.S. Cl.
CPC ............. *H03G 5/165* (2013.01); *H04R 29/004* (2013.01); *G01D 5/00* (2013.01); *H04R 1/222* (2013.01); *H04R 3/005* (2013.01); *H04R 29/006* (2013.01)

(58) Field of Classification Search
CPC ............ H04R 1/40; H04R 25/00; H04R 1/10; H04R 5/00; H04R 3/005; H04R 29/006; H04B 15/00; G01R 35/00; G01P 21/00; H03G 5/165; G01D 5/00
USPC ........... 381/26, 68, 69, 74, 97, 103, 154, 158, 381/94.3, 92, 122; 73/1.82, 1.39
See application file for complete search history.

(56) References Cited

U.S. PATENT DOCUMENTS

| | | | |
|---|---|---|---|
| 8,081,767 B2 * | 12/2011 | Chen | 381/59 |
| 8,654,992 B2 * | 2/2014 | Hayakawa | 381/97 |
| 8,798,290 B1 * | 8/2014 | Choi et al. | 381/94.1 |
| 2004/0194532 A1 * | 10/2004 | Lally et al. | 73/1.82 |
| 2009/0196429 A1 * | 8/2009 | Ramakrishnan et al. | 381/26 |

* cited by examiner

*Primary Examiner* — Vivian Chin
*Assistant Examiner* — Ubachukwu Odunukwe
(74) *Attorney, Agent, or Firm* — Li & Cai Intellectual Property (USA) Office (57) ABSTRACT

An exemplary embodiment illustrates an equalization pre-processing method, adapted for characterizing a second sound receptor unit in a sound receiving system based on knowing the internal structure parameters of a first sound receptor unit. The method includes: measuring a first sensitivity response of the first sound receptor unit and a second sensitivity response of the second sound receptor unit; equalizing the second sensitivity response according to the first sensitivity response and obtaining the differences in the sensitivity response; conducting simulation to obtain the third sensitivity response associated with the first sound receptor unit in the given sound receiving system; compensating the third sensitivity response to generate the fourth sensitivity response associated with the second sound receptor unit in the sound receiving system according to the differences in the sensitivity response; analyzing the fourth sensitivity response to characterize the second sound receptor unit in the given sound receiving system.

10 Claims, 8 Drawing Sheets

METHOD AND SYSTEM OF EQUALIZATION PRE-PREOCESSING FOR SOUND RECEIVNG SYSTEM

BACKGROUND

1. Technical Field

The present disclosure relates to a method and a system of equalization pre-processing in particular, to a method and a system of equalization pre-processing for sound receiving system.

2. Description of Related Art

As technology advances rapidly, electronic product such as cellular phones, personal digital assistant (PDA), tablet, and laptops have pay more and more attention to the sound quality thereof. In order to fulfill various functionalities of an electronic product while keep pace with the trends of miniaturization, system designers generally shrink the space occupied by acoustic components in the mechanical design. Further, to satisfy different sound quality requirements, various types of acoustic designs, i.e., different waveguide configure design including placement, shape, and length must be done on the electronic product. Accordingly, for a system forming of sound propagating through a waveguide is commonly referred as the sound receiving system.

Figure 1:
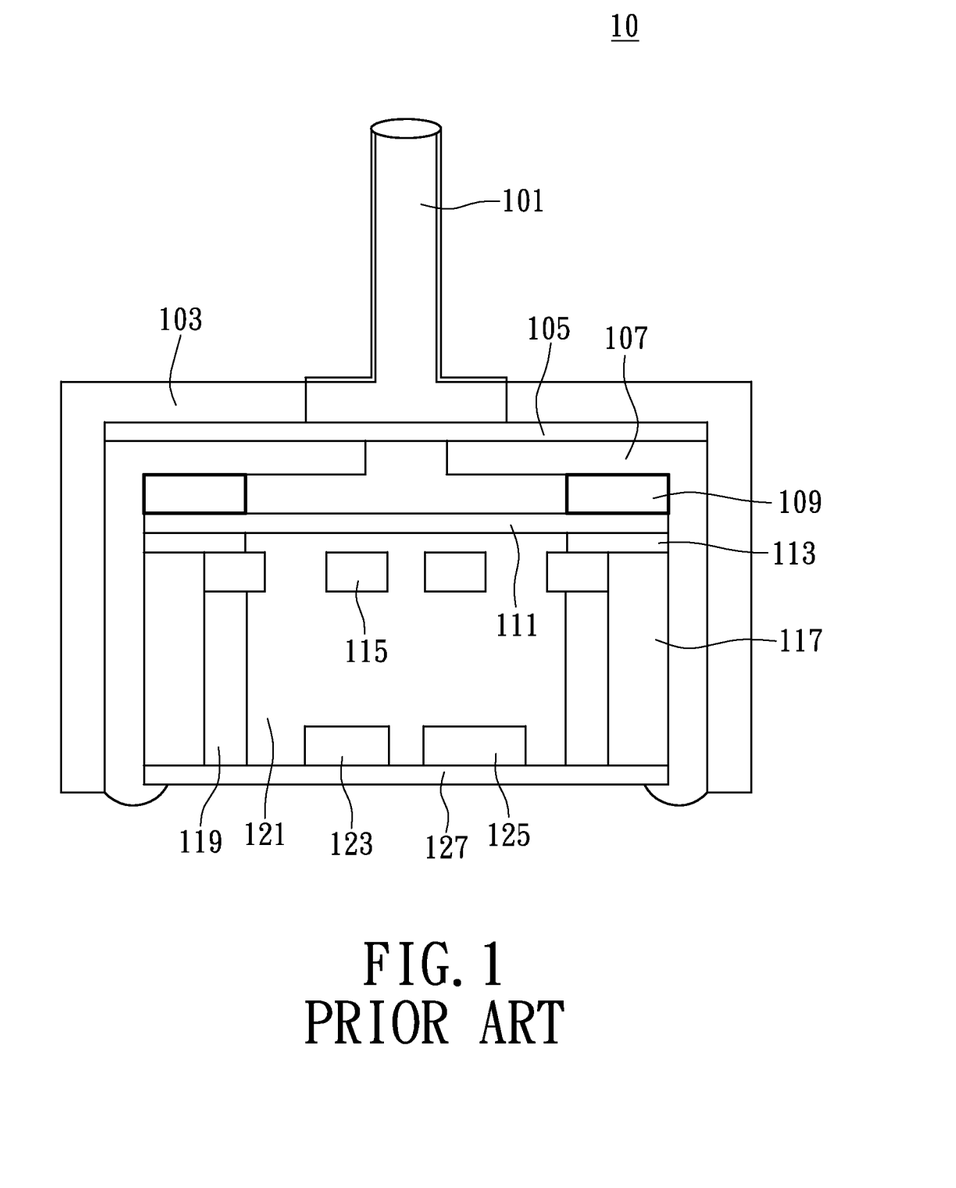
FIG. 1 is a section diagram of a conventional sound receiving system for a condenser microphone.

For example, please refer to FIG. 1, which provides a sectional view illustrating a sound receiving system for a typical condenser microphone. The sound receiving system for condenser microphone 10 includes a microphone unit, a waveguide 101, a plastic rubber 103 for shock absorption and air-tight purposes in system integration, as well as a cloth 105 placed on the microphone unit for dust and water proof application. The microphone unit further includes a cover 107 having sound inlet holes, a ring 109 for forming front cavity, a diaphragm 111 generating acoustic sound through air-squeeze process, a spacer 113, a backplate 115 having a plurality of sound holes, a holder 117, a conductor 119, a backchamber 121, a printed circuit board 127 coupled to the conductor 119, a FET 123 placed on the printed circuit board 127 for amplifying the acoustic signal, and a capacitor 125. Each of these necessary components used for forming the sound receiving system significantly affects the frequency response of the sound receiving (or playing) system, i.e. the sensitivity performance of the sound receiving system. Hence, in general, the sound receiving performance of a microphone unit not only relates to the microphone unit itself but also relates to the design of the associated waveguide. In addition, in order for sound receiving system of a microphone of the electronic product fulfilling the newer wideband voice testing regulations, the waveguide must designed in a way such that the sensitivity response is relatively flat within the frequency range of 100 Hz~8 KHz.

However, the sensitivity performance of a microphone unit in the sound receiving system would be often over amplified in some frequency band causing distortion in sound signal due to poor sound receiving system design. Furthermore, the sound receiving performance in the current design setting must wait after the mold for the product structure has being developed and obtain through actual measurement. Specifically, since it is in general hard for system designers to acquire the internal structure parameters of the microphone unit from the microphone manufacturer, consequently, system designers are unable to conduct waveguide analysis with unknown internal parameters of the microphone. Therefore the current design for the sound receiving system is basically developed through continuously testing and verifications on different types of new product based on past experience. Then modifies the design accordingly. Consequently, it is very likely to cause delays in product development increasing the development cost while not been able to instantly reflect the demand of customers.

SUMMARY

An exemplary embodiment of the present disclosure provides an equalization pre-processing method for sound receiving system. The method may utilize a sound receptor unit with known internal parameters to analyze an unknown sound receptor unit through using equivalent circuit method and equalization method so as to characterize the performance of the unknown sound receptor unit in a sound receiving system.

An exemplary embodiment of the present disclosure provides an equalization pre-processing method for a sound receiving system, adapted for characterizing a second sound receptor unit in a sound receiving system based on the known internal structure parameters of a first sound receptor unit. The method includes the following steps. First, a first equivalent circuit model is established in corresponding to the first sound receptor unit according to the internal structure parameters of the first sound receptor unit. Next, a first sensitivity response of the first sound receptor unit and a second sensitivity response of the second sound receptor unit are respectively acquired through measurement. Subsequently, the second sensitivity response is equalized according to the first sensitivity response to obtain the sensitivity differences between the first sensitivity response and the second sensitivity response. Then, a third sensitivity response associated with the first sound receptor unit in the sound receiving system is further obtained through simulating with the first equivalent circuit model. Afterward, the third sensitivity response is compensated according to the obtained sensitivity differences between the first sensitivity response and the second sensitivity response. Lastly, a fourth sensitivity response is obtained in corresponding to the second sound receptor unit in the sound receiving system for characterizing the second sound receptor unit in the sound receiving system.

An exemplary embodiment of the present disclosure provides an equalization pre-processing system for a sound receiving system, adapted for analyzing a first sensitivity response and a second sensitivity response respectively outputted by a first sound receptor unit and a second sound receptor unit through a measuring module. The equalization pre-processing system includes an equivalent circuit model establishing unit, an equalizing unit, a storage unit, a sound receiving system simulation unit, and a compensation unit. The equivalent circuit model establishing unit is used for establishing a first equivalent circuit model based on the known internal structure parameters and the material parameters of the first sound receptor unit so as to generate a first simulated sensitivity response. The equalizing unit is used for determining the accuracy of the first simulated sensitivity response and for equalizing the second sensitivity response according to the first sensitivity response to correspondingly generate a sensitivity response difference data. The storage unit is coupled to the equalizing unit. The storage unit is used for storing the sensitivity response difference data between the first sensitivity response and the second sensitivity response. The sound receiving system simulation unit may be used for generating a third sensitivity response in corresponding to the first sound receptor unit in a sound receiving system through simulating the first equivalent circuit model and a waveguide equivalent circuit model associated with a waveguide. The compensation unit is coupled to the storage unit and the sound receiving system simulation unit. The compensation unit is used for compensating the third sensitivity response according to the sensitivity response difference data between the first sensitivity response and the second sensitivity response so as to generate a fourth sensitivity response in corresponding to the second sound receptor unit in the sound receiving system.

According to one exemplary embodiment of the present disclosure, the first sound receptor unit and the second sound receptor unit may be condenser microphones, piezoelectric microphones, dynamic microphones, or Micro-Electrical-Mechanical System microphones.

To sum up, the present disclosure provides an equalization pre-processing method for a sound receiving system. The equalization pre-processing method may analyze and simulate the performance of a sound receptor unit without knowing the internal parameters thereof through utilizing both the sensitivity response equalization method and the equivalent circuit method. Accordingly, the designer of electronic product may quickly and accurately characterize the performance of the sound receiving system associated with the unknown sound receptor unit prior to the development of the product mold. Consequently, the sound receiving quality required for the applied product may be achieved while the research and development period for the microphone sound receiving system may be shorten thereby reduce the product development cost.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Reference will now be made in detail to the exemplary embodiments of the present disclosure, examples of which are illustrated in the accompanying drawings. Wherever possible, the same reference numbers are used in the drawings and the description to refer to the same or like parts.

The present disclosure provides an equalization pre-processing method for sound receiving system. The pre-processing method may effectively analyze the sound receiving system and accurately acquires product capability thereby reduce time and cost associated with the product development.

[An Exemplary Embodiment of Equivalent Circuit Associated with a Sound Receiving System for Condenser Microphone]

Figure 2:
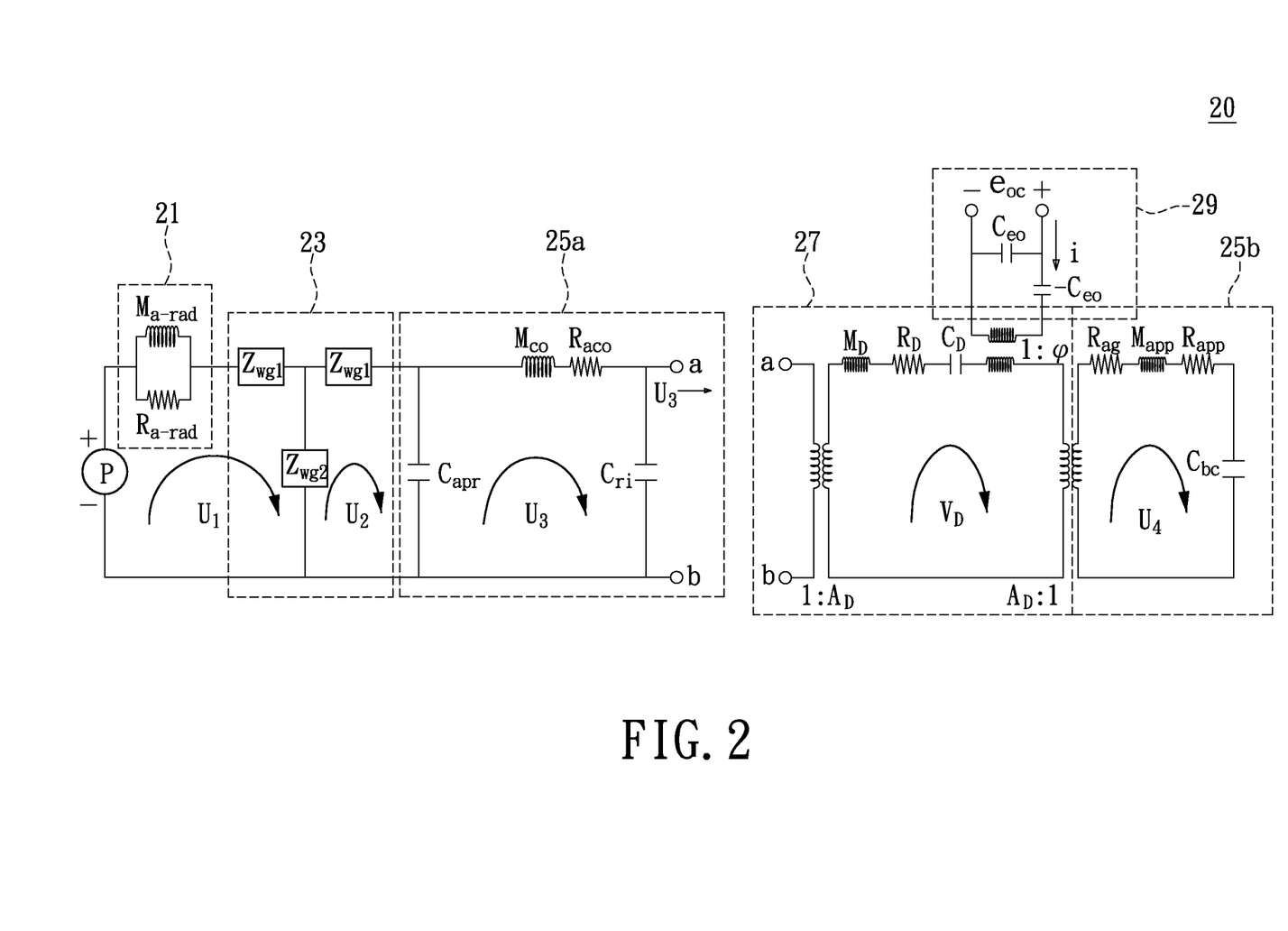
FIG. 2 is a circuit diagram of an equivalent circuit associated with condenser microphone in accordance to an exemplary embodiment of the present disclosure.

Please refer to FIG. 2 in conjunction with FIG. 1. FIG. 2 shows a circuit diagram illustrating an equivalent circuit in corresponding to the sound receiving system for condenser microphone of FIG. 1 according to an exemplary embodiment of the present disclosure. The sound receiving system for condenser microphone 10 as previously described includes a waveguide 101 and a microphone unit. The equivalent circuit 20 of the sound receiving system for condenser microphone 10 is developed using the equivalent circuit method. The equivalent circuit 20 may be utilized to simulate and analyze the characteristics of internal components and the associated structure as well as the impact on the acoustical transmission, i.e. the sensitivity response. Further, characteristics associated with different sound receiving system may be simulated and analyzed so as to obtain the corresponding design parameters (i.e., radius and length) of the waveguide structure for the microphone unit.

The equivalent circuit 20 of the sound receiving system for condenser microphone 10 includes an equivalent circuit of air radiation impedance 21, an acoustical equivalent circuit of waveguide 23, a front cavity acoustical equivalent circuit of microphone unit 25a, a back cavity acoustical equivalent circuit of microphone unit 25b, a mechanical equivalent circuit of microphone unit 27, and an electrical equivalent circuit of microphone unit 29. The front cavity acoustical equivalent circuit of microphone unit 25a, the back cavity acoustical equivalent circuit of microphone unit 25b, the mechanical equivalent circuit of microphone unit 27, and the electrical equivalent circuit of microphone unit 29 may couple to each other and perform energy conversion through transformers.

Specifically, acoustical pressure source P represents the strength of external acoustical pressure (e.g., the sound of human voice). The equivalent circuit of air radiation impedance 21 models the radiation impedance generated as the acoustical pressure travels through the air. The acoustical equivalent circuit of waveguide 23 models the waveguide equivalent circuit model and represents the response of the waveguide internal structure and dimension thereof generated in corresponding to the acoustical pressure. The front cavity acoustical equivalent circuit of microphone unit 25a, the back cavity acoustical equivalent circuit of microphone unit 25b, the mechanical equivalent circuit of microphone unit 27, and the electrical equivalent circuit of microphone unit 29 collectively form the equivalent circuit model of microphone unit and represent the response of the internal structure associated with microphone unit, dimension, and size thereof generated in corresponding to the acoustical pressure.

More specifically, as shown in FIG. 2, the equivalent circuit of air radiation impedance 21 may be represented via a parallel circuit formed of acoustic radiation mass, e.g., equivalent inductor $M_{a-rad}$ and acoustic radiation impedance, e.g. equivalent resistor $R_{a-rad}$.

The acoustical equivalent circuit of waveguide 23 may include the acoustic element (e.g., acoustic mass) which represents the response associated the internal structure of waveguide 101 generated in corresponding to the acoustical pressure. The acoustic mass of the waveguide 101 may be represented using equivalent circuit formed of impedance components as for instance, a T-network equivalent circuit (e.g., the circuit consists of impedance components $Z_{wg1}$ and $Z_{wg2}$) is used. In addition, an Exact Method may be further employed to analyze the acoustical pressure at two ends of the waveguide as well as volume varying speed thereof accompany with the T-matrix computation method so as to accurately analyze the characteristics of the waveguide 101 and the sensitivity response impact thereof on the sound receiving system.

The front cavity acoustical equivalent circuit of microphone unit 25a may include acoustical elements generated as acoustic pressure wave travels through the plastic rubber 103, an acoustic mass, and an acoustic resistance generated at the sound inlet hole wall as the acoustic pressure wave travels through the sound inlet hole of the cover 107, and acoustic elements (e.g. acoustic mass) generated as the acoustic pressure wave travels through the ring 109. As shown in FIG. 2, a capacitor $C_{apr}$ is the acoustic compliance representing the front cavity volume variation generated as the acoustic pressure wave travels through the plastics rubber 103. The acoustic mass and the acoustic resistance generated at the sound inlet hole are represented via the series circuit formed of an inductor $M_{co}$ and a resistance $R_{aco}$. Moreover, a capacitor Cri may be used to represent the acoustic compliance modeling the front cavity volume variation generated as the acoustic pressure wave travels through the ring 109. The series circuit of the inductor $M_{co}$ and the resistor $R_{aco}$ further parallelly connect to the capacitors $C_{ri}$ and $C_{apr}$.

The acoustical pressure source P is series-connected to the equivalent circuit of air radiation impedance 21 and is parallel-connected to the front cavity acoustical equivalent circuit of microphone unit 25a. To put it concretely, the acoustical pressure source P is series-connected to the equivalent circuit of air radiation impedance 21; the series-connected circuit of the acoustical pressure source P and the equivalent circuit of air radiation impedance 21 is further parallel-connected to the T-network equivalent circuit of waveguide 101 and the series circuit formed by the inductor $M_{co}$, the resistor $R_{aco}$, the capacitor $C_{ri}$, and the capacitor $C_{apr}$.

In addition, the back cavity acoustical equivalent circuit of microphone unit 25b may include the resistance simulating the response of the acoustic pressure wave traveling through the diaphragm 111 squeezing the air gap, the acoustic mass and the resistance for modeling the acoustic pressure wave travelling through the air hole of backplate 115 and the acoustic compliance effect generated as acoustic pressure wave travel through backchamber 121. Hence, the back cavity acoustical equivalent circuit of microphone unit 25b may be represented by the series circuit formed of a resistor $R_{ag}$, an inductor $M_{app}$, a resistor $R_{app}$, and a capacitor $C_{bc}$ in corresponding to the internal structure of microphone unit. Meanwhile the mechanical equivalent circuit of microphone unit 27 uses the series-connected circuit of an inductor $M_d$, a resistor $R_d$, and a capacitor $C_d$ modeling the acoustic mass, acoustic resistance, and acoustic compliance associated with the diaphragm 111.

The electrical equivalent circuit of microphone unit 29 may use the series-connected circuit of capacitor $C_{eo}$ and $-C_{eo}$ to model the sensed electric signal $e_{oc}$ of the microphone unit. Further the electrical equivalent circuit of microphone unit 29 may be represented with an open-circuit.

The front cavity acoustical equivalent circuit of microphone unit 25a is coupled to the mechanical equivalent circuit of microphone unit 27 through a transformer having energy conversion ratio of $1:A_D$. The mechanical equivalent circuit of microphone unit 27 is coupled to the back cavity acoustical equivalent circuit of microphone unit 25b through a transformer having energy conversion ratio of $A_D:1$. The mechanical equivalent circuit of microphone unit 27 is coupled to the electrical equivalent circuit of microphone unit 29 through a transformer having energy conversion ratio of $1:\phi$.

Based on the above elaborations, those skilled in the art should be able to infer the method of deriving and simplifying the equivalent circuit 20 associated with the sound receiving system for condenser microphone 10, e.g., energy conversion via conversion factor as well as equivalent circuit analysis and simulation of series and parallel circuit of a plurality of circuit element (e.g. equation derivation).

It is worth to note that even though the instant embodiment implements the equivalent circuit method based on the sound receiving system for condenser microphone, but the equivalent circuit method may be generalized and applied to sound receiving system of other types microphone, e.g., piezoelectric microphone, dynamic microphone, or Micro-Electrical-Mechanical System microphone, or other sound receiving system having sound receiving capability.

In addition, those skilled in the art should be able to understand that the actual equivalent circuit structure may vary according to the actual type and implementation of the microphone unit, and further may be able to infer the equivalent circuit establishment method of sound receiving system associated with other type microphone or other sound receiving system having sound receiving capability based on the equivalent circuit shown in FIG. 2, thus further descriptions are omitted.

Incidentally, the waveguide 101 may use other analysis method such as the multiple slice approximate method or the acoustic mass and resistance series method. The multiple slice approximate method utilizes multiple slice continuity concept by slicing the waveguide 101 into multiple parallel-connected T-matrices to characterize the waveguide 101. Whereas in the acoustic mass and resistance series method, the acoustic mass and the acoustic resistance are series connected, wherein the acoustic mass and the acoustic resistance are generated as acoustic pressure wave travels through the waveguide 101. Alternatively, the equivalent circuit model for waveguide 101 may vary according to different analyzation method adopted. The analyzation method for waveguide 101 described herein shall not be used to limit the instant disclosure. And those skilled in the art should be able to infer the implementation method of the multiple slice approximate method or the acoustic mass and resistance series method as well as the corresponding equivalent circuit structure, further descriptions are hereby omitted.

To sum up, the actual equivalent circuit model for the sound receiving system may vary according to the analyzation method adopted as well as the actual structure of the sound receiving system. Thus FIG. 2 only serves to illustrate one equivalent circuit model of a sound receiving system for condenser microphone and the present disclosure is not limited thereto.

[An Exemplary Embodiment of Equalization Pre-processing System for a Sound Receiving System]

Figure 3:
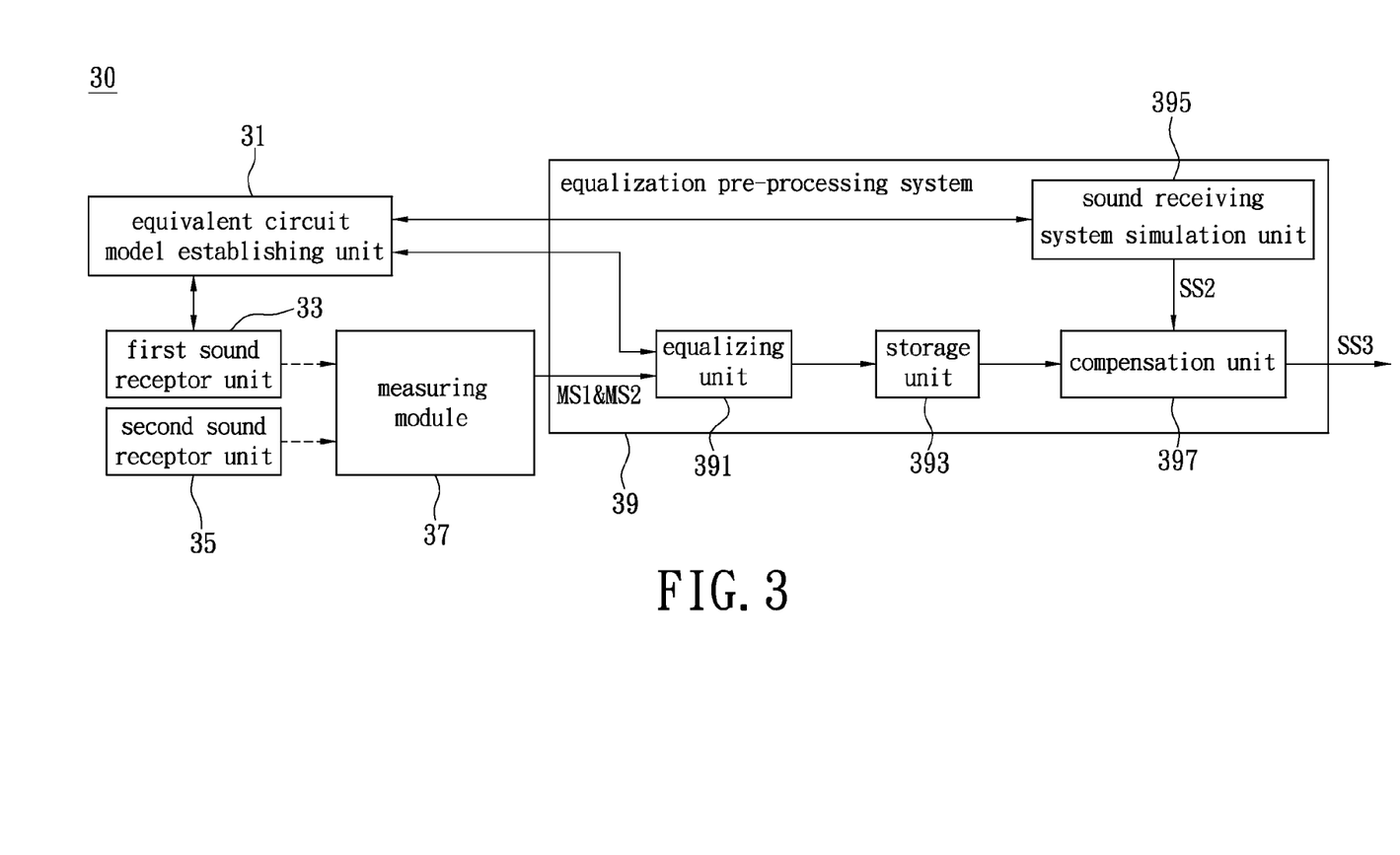
FIG. 3 is a block diagram of an audio processing system in accordance to an exemplary embodiment of the present disclosure.

Please refer to FIG. 3, which illustrates a block diagram of audio processing system in accordance to an exemplary embodiment of the present disclosure. The audio processing system 30 includes an equivalent circuit model establishing unit 31, a first sound receptor unit 33, a second sound receptor unit 35, a measuring module 37, and an equalization pre-processing system 39. The first sound receptor unit 33 and the second sound receptor unit 35 in the instant embodiment are implemented using condenser microphone units. The internal structure configuration, corresponding size relation and material parameters of the first sound receptor unit 33 (i.e., the first microphone) are known. For instance, the parameters related to the internal structure of the microphone unit may be obtained from the microphone manufacturer. The internal structure parameters and the corresponding sound receiving characteristics of the second sound receptor unit 35 (i.e., the second microphone) are unknown and must be acquired through the analyzation of the equalization preprocessing system 39. In other words, the audio processing system 30 may establish an equivalent circuit in corresponding to a sound receiving system through utilizing the previously described equivalent circuit structure. The audio processing system 30 may further through sensitivity response equalization and the sound receiving system simulation accurately predict the performance characteristics of the second sound receptor unit 35 in the sound receiving system.

The first sound receptor unit 33 and the second sound receptor unit 35 may transmit the acoustic information to the measuring unit 37, respectively. In addition, the equivalent circuit model establishing unit 31 and the measuring module 37 are respectively coupled to the equalization pre-processing system 39. The equalization pre-processing system 39 may thereby receive the acoustic sensitivity response information respectively from the first sound receptor unit 33 and the second sound receptor unit 35 to perform the corresponding sound receiving system characterization analysis and simulation accordingly.

The equivalent circuit model establishing unit 31 may establish a first equivalent circuit model in corresponding to the condenser microphone unit as shown in FIG. 2 (i.e., the front cavity acoustical equivalent circuit of microphone unit 25a, the back cavity acoustical equivalent circuit of microphone unit 25b, the mechanical equivalent circuit of microphone unit 27, and the electrical equivalent circuit of microphone unit 29) based on the known internal structure configurations, relative dimensions as well as the material parameters associated with the first sound receptor unit 33 (i.e. the first microphone) and outputs the related simulation data (e.g., the first simulated sensitivity response of the first sound receptor unit 33 and parameters of equivalent element associated with equivalent circuit of acoustical, mechanical and electrical) to the equalization pre-processing system 39.

The measuring module 37 may be used for obtaining the first sensitivity response of the first sound receptor unit 33 as well as the second sensitivity response of the second sound receptor 35 through measurement and outputting to the equalization pre-processing system 39 to perform comparative analysis.

Incidentally, the first sensitivity response and the second sensitivity response are the frequency response data in corresponding to the first sound receptor unit 33 and the second sound receptor unit 35, respectively. That is the level of sensitivity of the first sound receptor unit 33 and the second sound receptor unit 35 in responses to the acoustic wave in every frequency band.

In particular, the equalization pre-processing system 39 includes an equalizing unit 391, a storage unit 393, a sound receiving system simulation unit 395, and a compensation unit 397. The equalizing unit 391 is coupled to the storage unit 393. The storage unit 393 is coupled to the compensation unit 397. The sound receiving system simulation unit 395 is further coupled to the compensation unit 397 and the equivalent circuit model establishing unit 31.

The equalizing unit 391 receives the first sensitivity response of the first sound receptor unit 33 and the second sensitivity response of the second sound receptor unit 35, respectively outputted by the measuring module 37.

The equalizing unit 391 is used for equalizing the second sensitivity response according to the first sensitivity response so as to obtain the difference between the first sensitivity response and the second sensitivity response as well as storing the sensitivity response difference data in the storage unit 393, accordingly (e.g., tabulate the sensitivity difference table).

In addition, the equalizing unit 391 may further receive the equivalent circuit model establishing unit 31 simulated sensitivity response (i.e. the first simulated sensitivity response of the first equivalent circuit model) and compare against the actual measured first sensitivity response to verify the accuracy of the first equivalent circuit model. In other words, if the sensitivity difference between the first sensitivity response and the first simulated sensitivity response is lower than a predetermined threshold (i.e. the first predetermined sensitivity difference threshold) then the first equivalent model can accurately simulate the performance of the first sound receptor unit 33. Conversely, if the sensitivity difference between the first sensitivity response and the first simulated sensitivity response is higher than a predetermined threshold (i.e. the first predetermined sensitivity difference threshold) then the equivalent circuit model establishing unit 31 instantly modifies the associated parameters in the first equivalent circuit model (i.e. the equivalent circuit elements shown in FIG. 2), accordingly.

The sound receiving system simulation unit 395 conducts various sound receiving system simulation through utilizing the first equivalent circuit model established by the equivalent circuit model establishing unit 31 and correspondingly outputs the simulated sound receiving system sensitively response. To put it concretely, the sound receiving system simulation unit 395 may simulate various sound receive systems in corresponding to the first sound receptor unit 33 through modifying the equivalent circuit of the waveguide 101 (i.e. the acoustical equivalent circuit 23 of the waveguide 101) as shown in FIG. 2, accordingly so as to generate the corresponding simulated sensitivity response (i.e. the third sensitivity response) for the sound receiving system.

The compensation unit 397 compensates the third sensitivity response according to the computed difference (e.g., the sensitivity response difference data) between the first sensitivity response and the second sensitivity response, wherein the computed difference (e.g., the sensitivity response difference data) is stored in the storage unit 393. Incidentally, the third sensitivity response is generated by the sound receiving system simulation unit 395 in correspondence to the characteristics associated with a sound receiving system of the first sound receptor unit 33. For instance, by perform operations of increasing or attenuating the level of sensitivity generated in response to the acoustic wave in each frequency band, accordingly. Consequently the sensitivity response characterizing the performance of the second sound receptor unit 35 in the given sound receiving system may be generated.

Alternatively, the audio processing system 30 may obtain the sensitivity difference between the first sound receptor unit 33 and the second sound receptor unit 35 through equalizing the second sensitivity response of the second sound receptor unit 35 according to the first sensitivity response of the first sound receptor unit 33. In addition, the audio processing system 30 further analyzes the performance of the first sound receptor unit 33 in difference sound receiving system through simulating the equivalent circuit established base on the known internal structure configuration, relative dimensions and material parameters of the first sound receptor unit 33. Moreover, the audio processing system 30 correspondingly compensates the sensitivity response simulated from the simulated sound receiving system according to the sensitivity difference between the first sound receptor unit 33 and the second sound receptor unit 35 (i.e., the gain or attenuation in corresponding to the magnitude of the acoustic wave in each frequency band) to obtain the corresponding sensitivity response of the second sound receptor unit 35 in different sound receiving system.

It is worth to note that the audio processing system 30 in the instant embodiment is used for analyzing the sound receiving system for condenser microphone. However, in practice the audio processing system 30 may be adapted to analyze sound receiving system for different types of microphones including piezoelectric microphone, dynamic microphone, or Micro-Electrical-Mechanical System microphone as well as other sound receiving system having sound receiving capability. Therefore, the present disclosure does not limit the type, actual structure, and/or implementation method associated with the first and the second sound receptor units 33, 35. Similarly, the equivalent circuit model establishing unit 31 may establish the equivalent circuit which corresponds to the actual structure of the first sound receptor unit 33. Moreover, the measuring module 37 may include a sound source, a loud speaker, a signal amplifier, and an electroacoustic spectrometer. The measuring module 37 further may measure the first sensitivity response and the second sensitivity response in the anechoic chamber. Those skilled in the art should be able to infer the method of acquiring the first sensitivity response and the second sensitivity response, further descriptions are thereby omitted. In addition, the equivalent circuit model establishing unit 31 and the equalization pre-processing system 39 may be implemented using simulation software such as MATLAB.

To sum up, the present disclosure does not limit the exact type, actual circuitry structure, implementation method and/or connection method associated with the equivalent circuit model establishing unit 31, the first sound receptor unit 33, the second sound receptor unit 35, the measuring module 37, and the equalization pre-processing system 39.

[An Exemplary Embodiment of Equalization Pre-processing Method for a Sound Receiving System]

Figure 4:
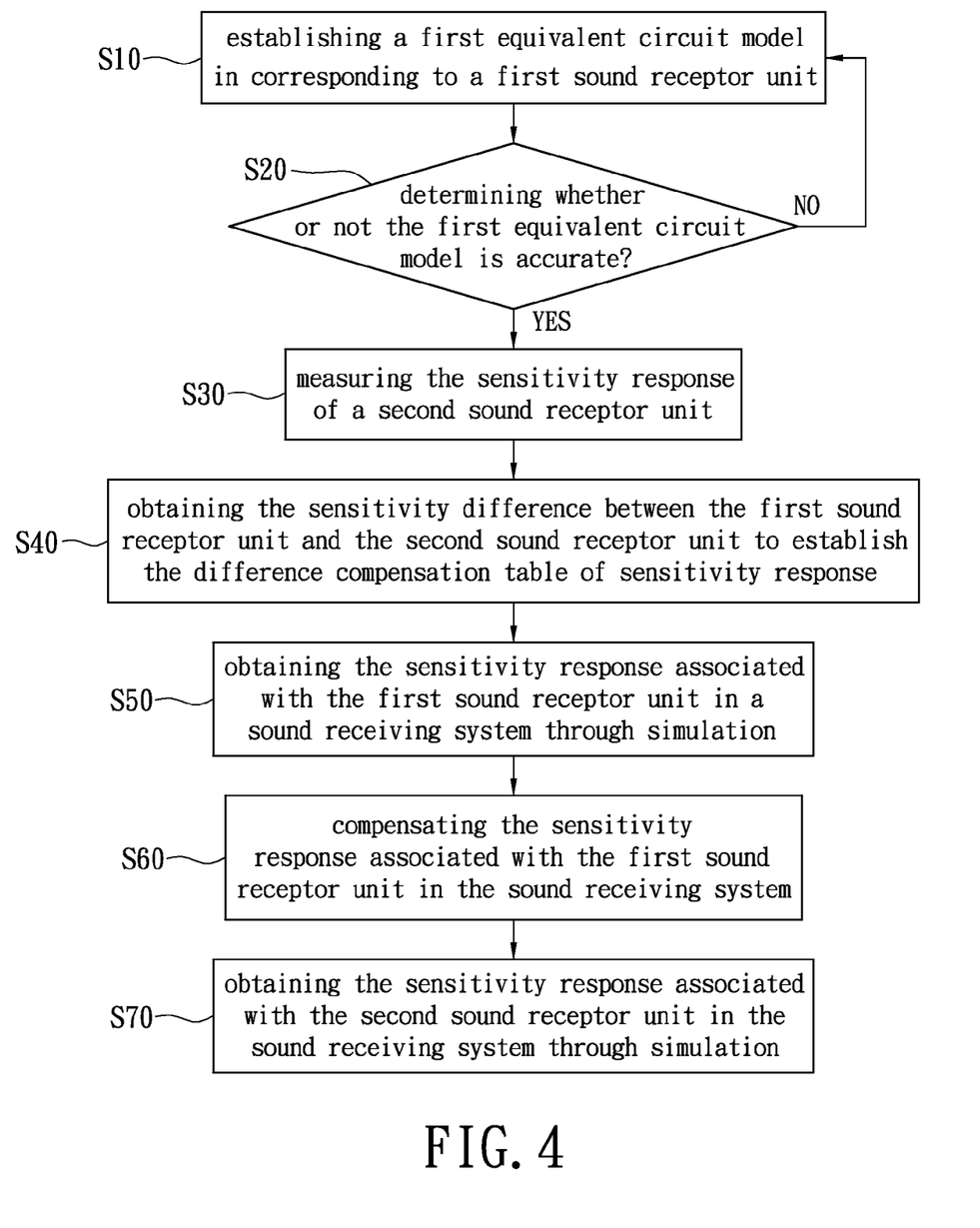
FIG. 4 is a flow chart diagram of an equalization pre-processing method in accordance to an exemplary embodiment of the present disclosure.
Figure 5:
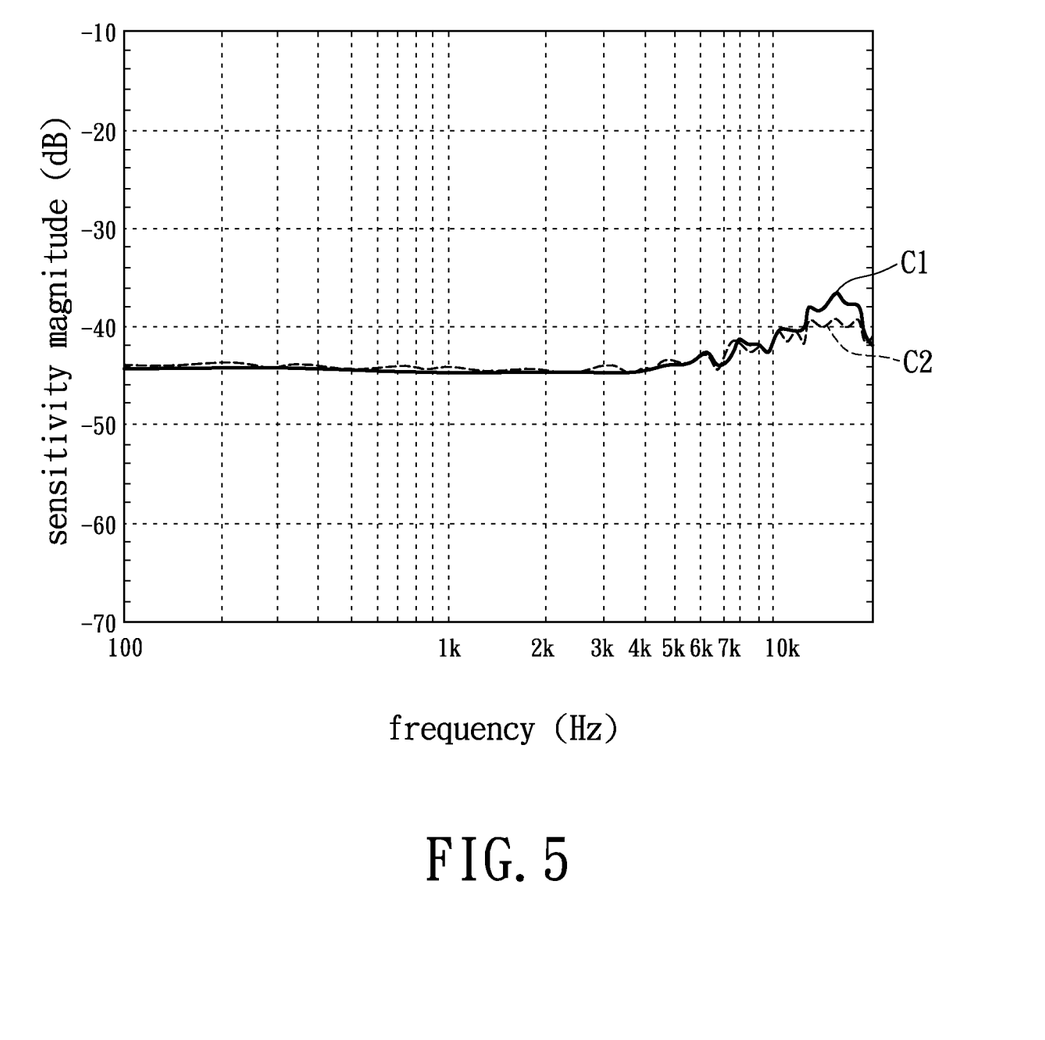
FIG. 5 is the measured and simulated sensitivity response for a second microphone sound receiving system with waveguide thereof having radius of 4.5 mm and length of 3 mm in accordance to an exemplary embodiment of the present disclosure.
Figure 6:
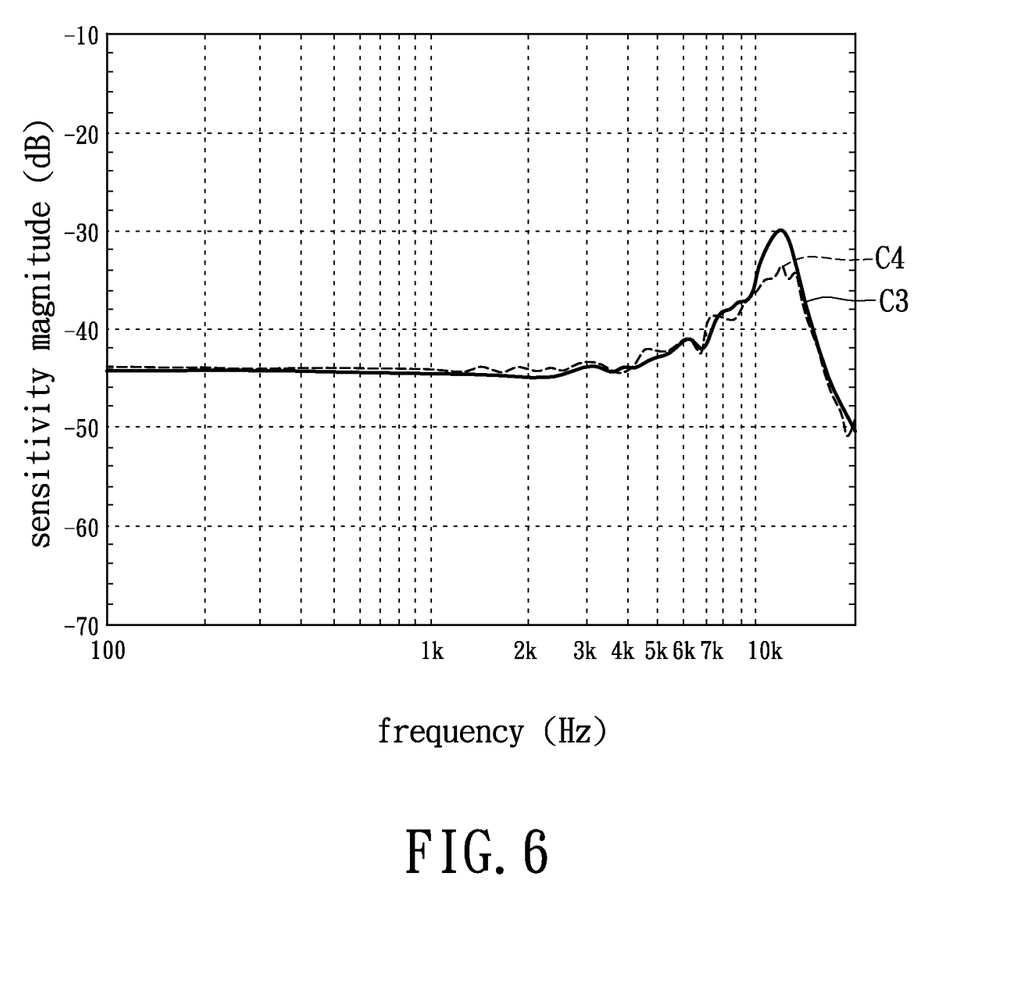
FIG. 6 is the measured and simulated sensitivity response for a second microphone sound receiving system with waveguide thereof having radius of 4.5 mm and length of 5 mm in accordance to an exemplary embodiment of the present disclosure.
Figure 7:
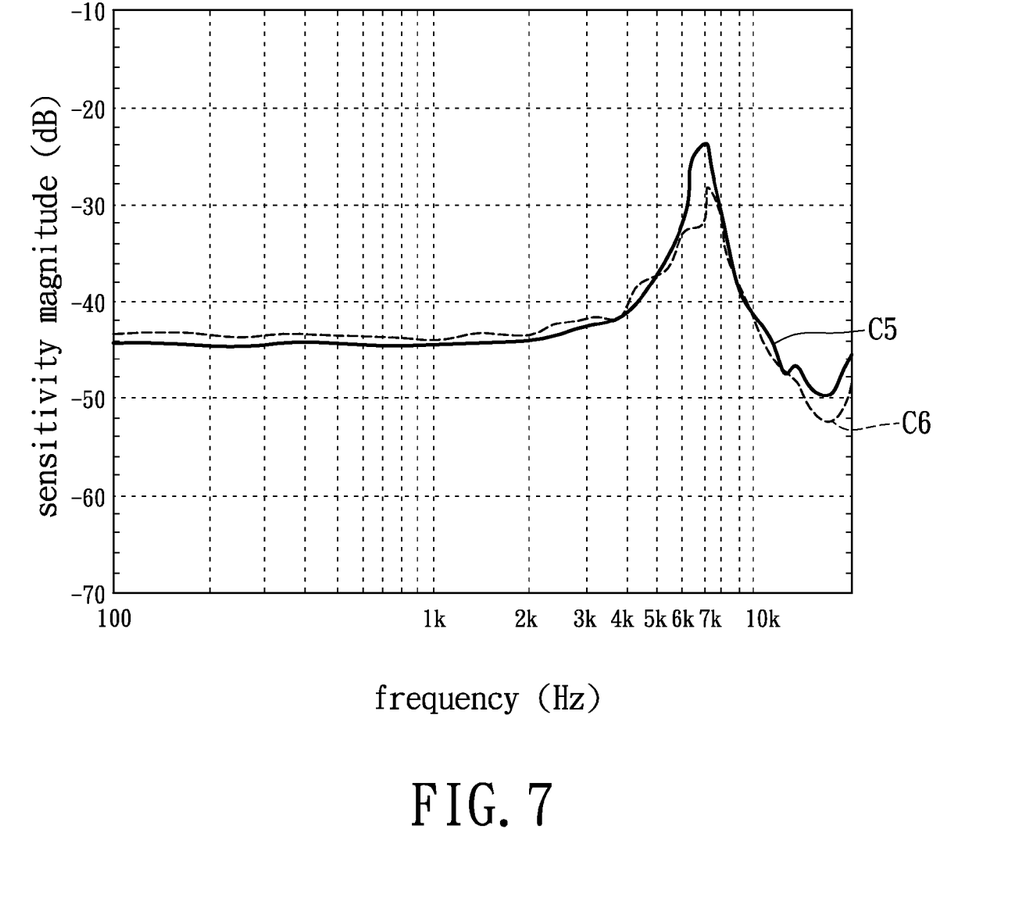
FIG. 7 is the measured and simulated sensitivity response for a second microphone sound receiving system with waveguide thereof having radius of 4.5 mm and length of 10 mm in accordance to an exemplary embodiment of the present disclosure.
Figure 8:
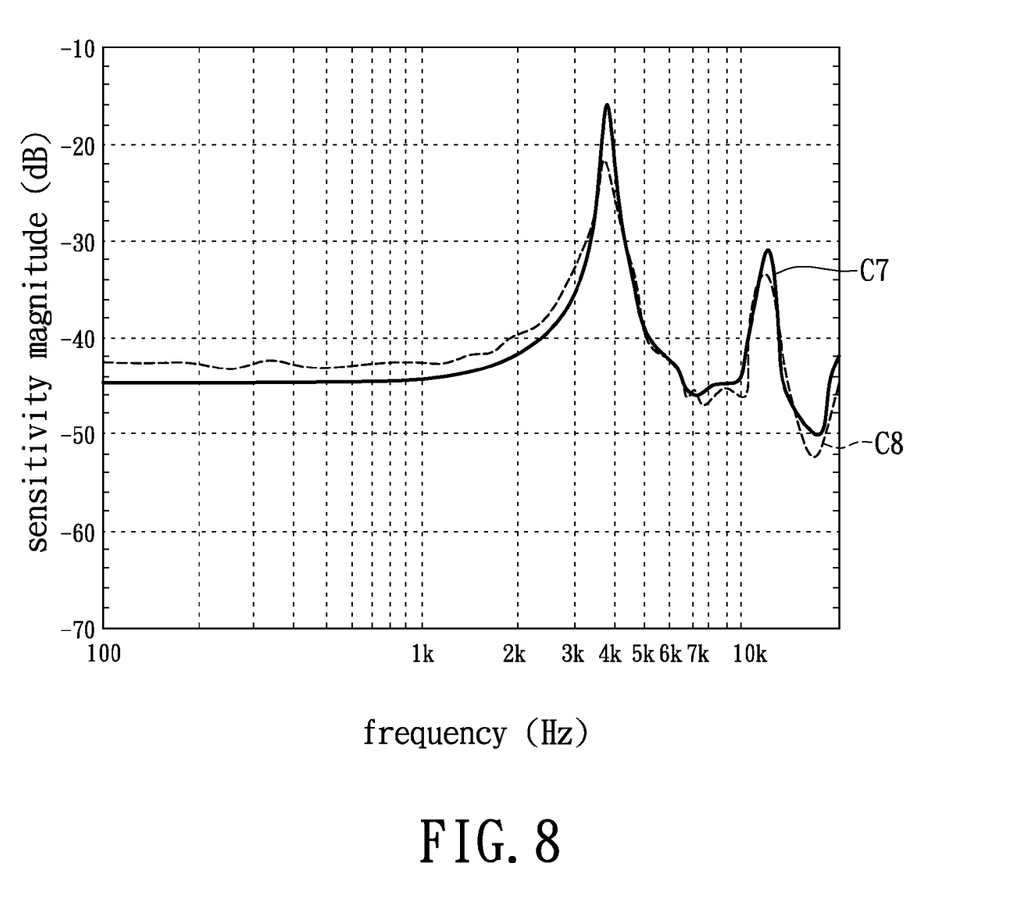
FIG. 8 is the measured and simulated sensitivity response for a second microphone sound receiving system with waveguide thereof having radius of 4.5 mm and length of 3 mm in accordance to an exemplary embodiment of the present disclosure.

Please refer to FIG. 4 in conjunction to FIG. 3. FIG. 4 provides a flow chart diagram illustrating an equalization pre-processing method in accordance to an exemplary embodiment of the present disclosure. The disclosed equalization pre-processing method may quickly and accurately simulate and analyze a sound receiving system of an unknown sound receptor unit through utilizing the equivalent circuit method. The first sound receptor unit 33 and the second sound receptor unit 35 in the instant embodiment as aforementioned may be implemented by condenser microphones. Furthermore, the internal structure parameters of the first sound receptor unit 33 (i.e. the first microphone) are known while the internal structure parameters associated with the second sound receptor unit 35 (i.e. the second microphone) are unknown.

In Step S10, the equivalent circuit model establishing unit 31 establishes a first equivalent circuit model according to the known internal structure parameters of the first sound receptor unit 33 by using the equivalent circuit method illustrated in FIG. 2. Subsequently, in Step S20, the accuracy of the first equivalent circuit model is further determined by the equalizing unit 391. To put it concretely, physically detects and obtains a first sensitivity response MS1 of the first sound receptor unit 33 using the measuring module 37. At same time, the equivalent circuit model establishing unit 31 generates a first simulated sensitivity response SS1 through analyzing and simulating with the first equivalent circuit model. Then, the equalizing unit 391 after receiving the first sensitivity response MS1 and the first simulated sensitivity response SS1 determines whether or not the sensitivity response between the first sensitivity response MS 1 and the first simulated sensitivity response SS1 is lower than a first predetermined sensitivity difference threshold TH_VAL via equalization. If the sensitivity response between the first sensitivity response MS 1 and the first simulated sensitivity response SS1 is lower than the first predetermined sensitivity difference threshold TH_VAL indicating that the first equivalent circuit model has accurately modeled the characteristics of the first sound receptor unit 33 and executes Step S30. Conversely, if the sensitivity response between the first sensitivity response MS1 and the first simulated sensitivity response SS1 is higher than the first predetermined sensitivity difference threshold TH_VAL indicating that there are discrepancies contained in the first equivalent circuit model. That is the performance of the first sound receptor unit 33 may not be accurately characterized and executes Step S10, i.e. have the equivalent circuit model establishing unit 31 modifying the first equivalent circuit model associated with the first sound receptor unit 33, accordingly.

In Step S30, the actual performance of the second sound receptor 35 is physically measured to obtain the second sensitivity response MS2 using the measuring module 37. Subsequently, obtains the sensitivity difference between the first sensitivity response MS1 and the second sensitivity response MS2 (i.e., MS1-MS2) so as to tabulate the difference compensations table of sensitivity response through equalization by the equalization unit 391 (Step S40). Next in Step S50, the sound receiving system simulation unit 395 utilizes the first equivalent model to conduct simulation analysis for a sound receiving system. To put it concretely, the sound receiving system simulation unit 395 establishes an equivalent circuit model (i.e., the first sound receiving system equivalent circuit model) associated with a first sound receiving system (i.e., the first microphone sound receiving system) through integrating the first equivalent circuit model in corresponding to the internal structure of the first sound receptor unit 33 and a waveguide equivalent circuit model in corresponding to the internal structure of a waveguide. The sound receiving system simulation unit 395 further conducts computation analysis to simulate a third sensitivity response SS2 in corresponding to the established first sound receiving system.

Then in Step S60, the third sensitivity response SS2 obtained from simulation is compensated according to the difference compensation table of sensitivity response so as to generate a fourth sensitivity response SS3 which corresponds to the simulated sound receiving system of the second sound receptor 35. Consequently, the sound receiving performance associated with a second sound receiving system of the second sound receptor unit 35 may be accurately characterized.

Hence, a relative optimal waveguide design associated with the second sound receptor unit 35 may be obtained through modifying the component parameters of the first sound receiving equivalent circuit in corresponding to the first sound receiving system. Accordingly, the sound receiving system of the second sound receptor unit 35 having ideal sound receiving quality may be designed.

Furthermore, the accuracy of the fourth sensitivity response SS3 may be verified through comparing the fourth sensitivity response SS3 with the second sound receiving system sensitivity response MS3 which is obtained through actually measuring the performance of the second sound receiving system.

Incidentally, the disclosed equalization pre-processing method for sound receiving system may further includes comparing the fourth sensitivity response SS3 and a predetermined sensitivity response. For instance, the sound receiving system simulation unit 395 can determine whether or not the difference between the fourth sensitivity response SS3 and the predetermined sensitivity response is lower than a second predetermined sensitivity difference threshold (i.e., predetermined sensitivity threshold). Then the sound receiving system simulation unit 395 correspondingly configures the parameters of the first sound receiving system equivalent circuit to acquire the corresponding structure design parameters associated with the sound receiving system of the second sound receptor unit 35 thereby achieve the sound receiving quality required for the second sound receiving system.

In actual implementation, the equalization pre-processing computation method may be implemented through simulated software, e.g. MATLAB. In addition, the equalization pre-processing method disclosed in the instant embodiment is used to analyze the sound receiving system for condenser microphone through simulation. However, the audio processing system 30 as previously described may also be adapted for analyzing and simulating sound receiving systems of other types microphone including piezoelectric microphone, dynamic microphone, or Micro-Electrical-Mechanical System microphone as well as other types of sound receiving system having sound receiving capability, however the present disclosure is not limited to the examples provided herein. Moreover, the first predetermined sensitivity difference threshold TH_VAL and the second predetermined sensitivity difference threshold (i.e., predetermined sensitivity threshold) may be configured according to the actual design needs.

Consequently, the present disclosure does not limit the implementation method of the first equivalent circuit model associated with the first sound receptor unit 33 and the accuracy verify method thereof. Similarly the present disclosure does not limit the actual implementation method of the first predetermined sensitivity difference threshold TH_VAL and the second predetermined sensitivity difference threshold (i.e., predetermined sensitivity threshold) as well as the actual applications and analyzing method of the fourth sensitivity response SS3 associated with the second sound receiving system. It shall be noted, FIG. 4 only serves to illustrate an equalization pre-processing method in accordance to the exemplary embodiment of the present disclosure, and the present disclosure is not limited thereto.

Please refer to FIG. 5~FIG. 8., wherein FIG. 5~FIG. 8 respectively illustrates the measured and simulated sensitivity response for an unknown second microphone sound receiving system (i.e. the sound receiving system of the second sound receptor 35) having various sound receiving characteristics using the equalization pre-processing method provided in accordance to an exemplary embodiment of the present disclosure.

Specifically, FIG. 5~FIG. 8 respectively illustrates the measured and simulated sensitivity response for the microphone sound receiving system having the waveguide with radius of 4.5 mm while length thereof being 3 mm, 5 mm, 10 mm and 20 mm. Accordingly, curves C1, C3, C5, and C7 respectively represent the sensitivity response of the sound receiving system simulated using the equalization pre-processing method with the described equivalent circuit structure provided in accordance to an exemplary embodiment of the present disclosure. Curves C2, C4, C6, and C8 on the other hand respectively represent the sensitivity response of the sound receiving system physically measured in the anechoic chamber.

It may be observed from FIG. 5~FIG. 8, the trend and the peak value associated with the physically measured sensitivity response as well as the simulated sensitivity response of the equivalent circuit are nearly identically only with difference of 4 dB in the peak value. Through analyzing the described plot, the impact of the structure of waveguide and dimension thereof of the sound receiving system may be understood. That is the peak value at high frequency increases as the length of waveguide increases while the resonance frequency shifts toward lower frequency end thereby reduces the acceptable frequency range of the sound receiving system. Consequently, a sound receiving system satisfying high sound receiving quality requirements (e.g., the acceptable frequency range of the microphone sound receiving system) may be designed through performing simulation analysis for the sound receiving system with sound receptor unit (e.g., microphone) having unknown parameters. Additionally, FIG. 5~FIG. 8 clearly show that as long as the designed equivalent circuit structure can accurately characterize the sound receiving performance of the known sound receptor unit and the associated sound receiving system, the performance of the unknown sound receptor unit may be analyzed through the aforementioned equalization pre-processing method. It is worth to note that FIG. 5~FIG. 8 only used for illustrating the measured and simulated sensitivity response for the sound receiving system with different sound receiving performance hence shall not be used to limit the present disclosure.

In summary, the equalization pre-processing method for sound receiving system provided by the instant disclosure may conduct simulation and analysis on the sound receiving system of sound receptor unit having unknown parameters. Accordingly, prior to the mold development, the electronic product designer may utilize the equalization pre-processing method, quickly and accurately conduct simulation for the sound receiving system of microphone thereby can effectively characterize the overall performance of sound receiving system having unknown sound receptor unit. Thus the disclosed equalization pre-processing method and system may effectively reduce the cost and time needed for the sound receiving system development. Meanwhile, may aid in the structural design of the sound receiving system in the electronic product through modifying the structure parameters associated with the sound receiving system thereby achieving market demand on high sound receiving quality.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. An equalization pre-processing method, adapted for characterizing a second sound receptor unit in a sound receiving system based on knowing the internal structure parameters of a first sound receptor unit, the method comprising:
    establishing a first equivalent circuit model corresponding to the first sound receptor unit according to the internal structure parameters of the first sound receptor unit;
    acquiring a first sensitivity response of the first sound receptor unit and a second sensitivity response of the second sound receptor unit through measurement;
    equalizing the second sensitivity response according to the first sensitivity response and obtaining the sensitivity differences between the first sensitivity response and the second sensitivity response;
    obtaining a third sensitivity response associated with the first sound receptor unit in the sound receiving system through simulating the first equivalent circuit model;
    compensating the third sensitivity response obtained from simulation according to the sensitivity differences between the first sensitivity response and the second sensitivity response; and
    obtaining a fourth sensitivity response corresponding to the second sound receptor unit in the sound receiving system for characterizing the second sound receptor unit in the sound receiving system;
    wherein establishing the first equivalent circuit model, acquiring the first sensitivity response and the second sensitivity response, equalizing the second sensitivity response according to the first sensitivity response and obtaining the sensitivity differences, obtaining the third sensitivity response compensating the third sensitivity response, and obtaining the fourth sensitivity response are implemented by a processor.

2. The equalization pre-processing method according to claim 1, further comprising:
    simulating with the first equivalent circuit model to generate a first simulated sensitivity response; and
    determining whether or not the difference between the first simulated sensitivity response and the first sensitivity response is lower than a first predetermined sensitivity difference threshold and correspondingly modifying the first equivalent circuit model when the difference between the first simulated sensitivity response and the first sensitivity response is higher than the first predetermined sensitivity difference threshold.

3. The equalization pre-processing method according to claim 1, further comprising:
    establishing a difference compensation table of sensitivity response at the step of equalizing the second sensitivity response according to the first sensitivity response.

4. The equalization pre-processing method according to claim 2, wherein the step of generating the third sensitivity response further comprising:
    establishing a first sound receiving system equivalent circuit model by utilizing the first equivalent circuit model and a waveguide equivalent circuit model; and
    performing computation and simulation to the first sound receiving system equivalent circuit model to obtain the third sensitivity response;
    wherein the waveguide equivalent circuit model is formed based on at least one of the volume parameter, the structure configuration parameter, and the material parameter associated with a waveguide.

5. The equalization pre-processing method according to claim 4, further comprising:
    modifying at least one of the volume parameter, the structure configuration parameter, and the material parameter associated with the waveguide according to the fourth sensitivity response to have the difference between the forth sensitivity response and a predetermined sensitivity response being lower than a predetermined sensitivity difference threshold.

6. The equalization pre-processing method according to claim 1, wherein the first sound receptor unit and the second sound receptor unit comprise of condenser microphones, piezoelectric microphones, dynamic microphones, or Micro-Electrical-Mechanical System microphones.

7. An equalization pre-processing system for a sound receiving system, adapted for analyzing a first sensitivity response and a second sensitivity response respectively outputted by a first sound receptor unit and a second sound receptor unit through a measuring module, the system comprising:
    an equivalent circuit model establishing unit, for establishing a first equivalent circuit model based on the internal structure parameters and the material parameters of the first sound receptor unit so as to generate a first simulated sensitivity response;
    an equalizing unit, determining the accuracy of the first simulated sensitivity response and equalizing the second sensitivity response according to the first sensitivity response to generate a corresponding sensitivity response difference data;
    a storage unit, coupled to the equalizing unit, storing the sensitivity response difference data between the first sensitivity response and the second sensitivity response;
    a sound receiving system simulation unit, obtaining a third sensitivity response in corresponding to the first sound receptor unit in the sound receiving system through simulating a first sound receiving system equivalent circuit model, wherein the first sound receiving system equivalent circuit model is established by the first equivalent circuit model and a waveguide equivalent circuit model associated with a waveguide;
    a compensation unit, coupled to the storage unit and the sound receiving system simulation unit, compensating the third sensitivity response according to the sensitivity response difference data between the first sensitivity response and the second sensitivity response so as to generate a fourth sensitivity response in corresponding to the second sound receptor unit in the sound receiving system for characterizing the second sound receptor unit in the sound receiving system.

8. The equalization pre-processing system according to claim 7, wherein the first equivalent circuit model comprises of a plurality of transformers and a plurality of series-connected and parallel-connected electrical components, wherein the electrical components comprise of capacitors, resistors, and inductors, wherein said transformers are used for energy transformation among acoustical energy, mechanical energy, and electrical energy.

9. The equalization pre-processing system according to claim 7, wherein the equalization pre-processing system is implemented using MATLAB.

10. The equalization pre-processing system according to claim 7, wherein the first sound receptor unit and the second sound receptor unit comprise of condenser microphones, piezoelectric microphones, dynamic microphones, or Micro-Electrical-Mechanical System microphones.

* * * * *